United States Patent
Dähn

(10) Patent No.: US 6,320,804 B2
(45) Date of Patent: Nov. 20, 2001

(54) INTEGRATED SEMICONDUCTOR MEMORY WITH A MEMORY UNIT A MEMORY UNIT FOR STORING ADDRESSES OF DEFECTIVE MEMORY CELLS

(75) Inventor: Wilfried Dähn, Celle (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/751,958

(22) Filed: Dec. 29, 2000

(30) Foreign Application Priority Data

Dec. 29, 1999 (DE) .............................. 199 63 689

(51) Int. Cl.$^7$ ............................................. G11C 29/00
(52) U.S. Cl. ....................... 365/201; 365/200; 714/30
(58) Field of Search .................... 365/201, 200, 365/185.09, 189.07; 714/30

(56) References Cited

U.S. PATENT DOCUMENTS 5,737,269 * 4/1998 Fujita .................................. 365/200
6,259,639 * 7/2001 Hashizume ........................... 365/201
6,269,030 * 7/2001 Hara ..................................... 365/200

FOREIGN PATENT DOCUMENTS 39 24 695 A1   2/1990 (DE) .

OTHER PUBLICATIONS

Ramsey W. Haddad et al.: "Increased Throughput For The Testing And Repair Of RAM's With Redundancy", IEEE Transactions On Computers, vol. 40, No. 2, Feb. 1991, p. 154–166.

* cited by examiner

Primary Examiner—Tan T. Nguyen
(74) Attorney, Agent, or Firm—Herbert L. Lerner; Laurence A. Greenberg; Werner H. Stemer

(57) ABSTRACT

An integrated semiconductor memory which can be subjected to a memory cell test for determining operative and defective memory cells has addressable normal memory cells (MC) and redundant memory cells (RMC) for replacing, in each case, one of the normal memory cells (MC). A memory unit (2) for storing addresses (ADR) of defective normal memory cells (MC) serves as a buffer memory. A preprocessing device (3) has a memory device (4, 5) for storing a fixed number of addresses (ADR) of defective normal memory cells (MC). It serves for the comparison between the stored addresses (ADR) and for the outputting of an output signal (S31) according to the result of the comparison. This serves for controlling the storing operation of the memory unit (2). A suitable comparison between the addresses (ADR) allows defect information to be filtered out for a subsequent redundancy analysis, whereby the size of the memory unit (2) can be kept comparatively small.

6 Claims, 2 Drawing Sheets

INTEGRATED SEMICONDUCTOR MEMORY WITH A MEMORY UNIT A MEMORY UNIT FOR STORING ADDRESSES OF DEFECTIVE MEMORY CELLS

BACKGROUND OF THE INVENTION

Field of the Invention

The present invention relates to an integrated semiconductor memory which can be subjected to a memory cell test for determining operative and defective memory cells, and which has a memory unit for storing addresses of defective memory cells.

For the repair of defective memory cells, integrated semiconductor memories generally have redundant memory cells, which are usually combined to form redundant row lines or redundant column lines which can replace regular lines with defective memory cells on an address basis. In this case, the integrated memory is tested, for example by an external testing device or a self-testing device, and programming of the redundant elements is subsequently performed on the basis of a so-called redundancy analysis. A redundancy circuit then has programmable elements, for example in the form of programmable fuses, which serve for storing the address of a line to be replaced.

A semiconductor memory device is tested, for example after the production process, and is subsequently repaired. For this purpose, the addresses of those tested memory cells which were detected as defective are stored in a so-called defect address memory, in order to replace these memory cells in a subsequent step with defect-free redundant memory cells on the basis of the addresses stored. The memory device is in this case generally subjected to a number of tests. Only those memory cells that pass all of the tests are considered in this case to be operative or defect-free. If a memory cell does not pass one or more tests, it is considered to be defective and must be replaced by a defect-free redundant memory cell. In the case of semiconductor memories with a memory cell array in matrix form, which have redundant row lines or redundant column lines, instead of a single memory cell usually an entire row line or column line is replaced by corresponding redundant row lines or column lines.

Since memory cells are subjected to a number of tests, if a particular test is not passed, it must be determined whether the defect address has already been stored because of a failure of a previous test. This determination must be performed before the address of the defective memory cell is stored. If this is the case, the defect address should not be stored a second time, in order to save memory space. The defect addresses may be stored in a separate memory cell array on the chip to be tested. This additional memory cell array is then part of, for example, a self-testing device of the memory chip.

The check to be carried out to ascertain whether a memory cell has already been stored once must not influence the speed with which the memory test is carried out. For example, a parallel comparison of all of the defect addresses already stored with the current defect address, and possibly the subsequent storage of the new address, can in this case take place together in one clock cycle. However, this generally leads to the provision of a considerable amount of circuitry for the defect address memory. A serial comparison of the stored defect addresses with the current defect address is possible only if it can be ensured that the time from detecting one defective memory cell to detecting the next defective memory cell reaches a certain length. This time must be made to be of such a duration to insure that the address of a previously detected defective memory cell can be compared with all of the already stored defect addresses and the address of this detected defective memory cell can possibly be stored before another defective memory cell is detected. Since defective memory cells often occur in rapid succession in a memory cell test, in particular along row lines or column lines, the time periods described usually cannot be maintained.

As long as the number of defective memory cells is small in comparison with the memory size, a memory unit can be provided as a buffer memory, in order to decouple a test of the memory cell array and the storage of the defect addresses. This buffer memory must in this case be large enough to ensure that the addresses of memory cells detected as defective can at any time still be written to be buffer memory. The maximum size of the buffer memory to be provided can be estimated on the basis of the size of the memory to be tested and the existing number of redundant row lines and column lines. For example, all the memory cells along a column line and at the same time as many column lines as it takes to establish that there is no redundant column line available any longer for the repair of defective memory cells along a column line must be tested. This results in a relatively high storage requirement of the buffer memory to be provided. For memory devices with an in-built self-testing unit, such a solution is usually too complex.

SUMMARY OF THE INVENTION

It is accordingly an object of the invention to provide a semiconductor memory which overcomes the above-mentioned disadvantageous of the prior art semiconductor memories of this general type. More specifically, an object is to provide a semiconductor memory that can be subjected to a memory cell test, wherein the semiconductor memory has a memory unit for storing addresses of defective memory cells, and wherein the storage requirement of the memory unit is as small as possible.

With the foregoing and other objects in view there is provided, in accordance with the invention an integrated semiconductor memory which has, along with addressable normal memory cells, addressable redundant memory cells for replacing one of the normal memory cells. Furthermore, the memory has a memory unit for storing addresses of defective normal memory cells. The memory unit has a control input for controlling the storing operation of the memory unit and an output for outputting the memory content. A preprocessing device has a memory device for storing a fixed number of addresses of defective normal memory cells. It serves for the comparison between the stored addresses and the outputting of an output signal according to the result of the comparison. The preprocessing device has, furthermore, an output for the outputting of the output signal, which is connected to the control input of the memory unit. With a circuit configuration of this type, in which defect information is buffer-stored in the memory unit in the course of a memory test, the size of the memory unit can be kept small.

The size of the memory unit is kept small because the defect information irrelevant to the repair phase following the test has already been filtered out by the preprocessing device during the buffer storage in the memory unit. This irrelevant information is no longer stored. The comparison carried out for this purpose between the defect addresses stored in the preprocessing device takes place in a suitable way with regard to which of the normal memory cells are to be replaced by which of the redundant memory cells. There consequently takes place a kind of preprocessing of the defect information, present in the form of addresses of defective memory cells, with regard to the subsequent redundancy analysis.

In accordance with an added feature of the invention, the addresses of memory cells which are configured in a memory cell array in matrix form and are combined into addressable units of column lines and row lines have, for example, a first address part, via which the respective column line is accessed, and a second address part, via which the respective row line is accessed. Accordingly, the memory device of the preprocessing device has, for example, register units for the storing of in each case one of the address parts, which are connected to each other in the form of a shift register.

In accordance with an additional feature of the invention, the outputs of the register units are connected to corresponding inputs of a comparison device for a comparison between the contents of the register units. An output of the comparison device is connected to the output of the preprocessing device and consequently to the control input for controlling the storing operation of the memory unit.

As described at the beginning, the (permanent) storage of defect addresses from a number of tests to be carried out takes place, for example, in a defect address memory, which is located in a separate memory cell array on the semiconductor chip to be tested. Accordingly, the circuit configuration has a further memory unit for storing addresses of defective normal memory cells, which is connected to the output of the memory unit for taking over one of the addresses stored in the memory unit.

A filtering of defect information already during the buffer storage in the memory unit is possible by the circuit configuration according to the invention, so that a relatively small number of defect addresses have to be stored in the defect address memory. This may mean a considerable time advantage in the subsequent redundancy analysis, for example in a self-testing unit, since a comparatively small number of defect addresses from the defect address memory have to be processed.

Other features which are considered as characteristic for the invention are set forth in the appended claims.

Although the invention is illustrated and described herein as embodied in an integrated semiconductor memory with a memory unit for storing addresses of defective memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
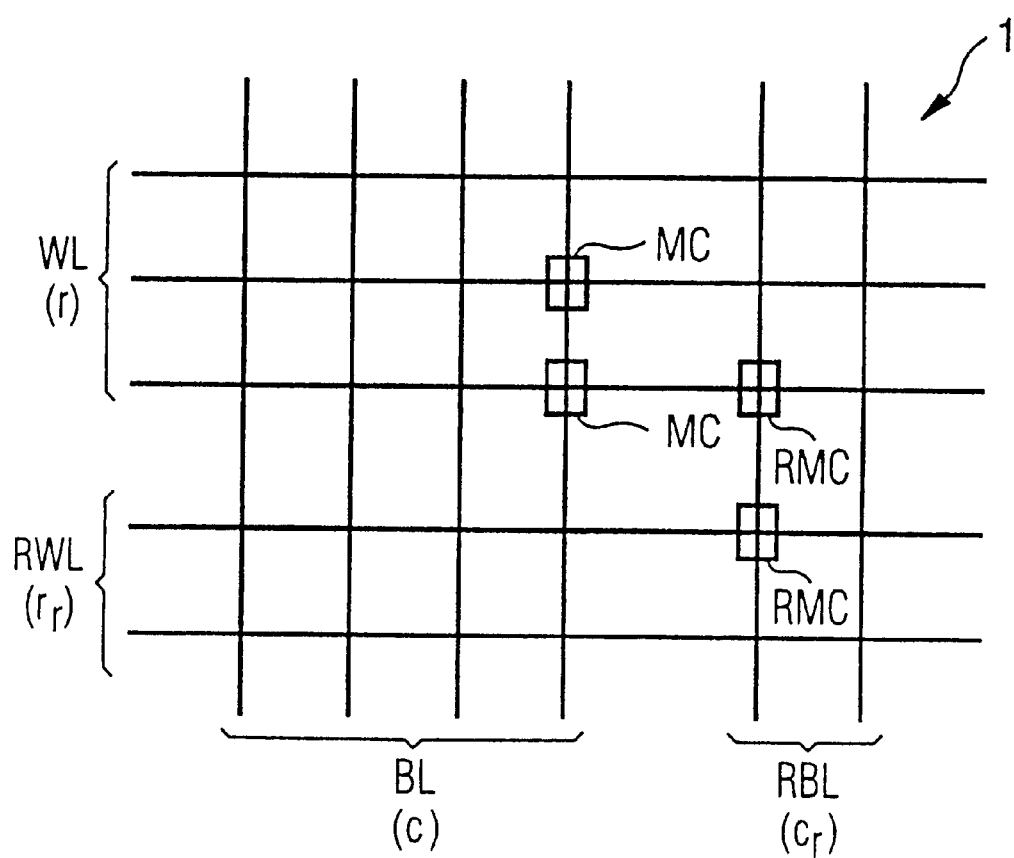
FIG. 1 shows a schematic representation of a memory cell array in matrix form of a semiconductor memory.

Referring now to the figures of the drawing in detail and first, particularly, to FIG. 1 thereof, there is shown a memory cell array 1, organized in matrix form, for example of a DRAM. The memory cell array 1 has regular row or word lines WL, column or bit lines BL, redundant word lines RWL and redundant bit lines RBL, at the crossing points of which memory cells MC or redundant memory cells RMC are configured. The memory cells MC or RMC of the memory shown in each case contain a selection transistor and a storage capacitor. In this configuration, control inputs of the selection transistors are connected to one of the word lines WL or redundant word lines RWL, while a main current path of the selection transistors is configured between the storage capacitor of the respective memory cell MC or RMC and one of the bit lines BL or RBL.

Testing systems that use a so-called Fail Address Memory (FAM), store the addresses of defective memory cells MC of the device to be tested in the way described above. The maximum size of the buffer memory to be provided can be estimated on based on the size of the memory cell array to be tested and on the existing number of redundant bit lines and redundant word lines. If, for example, a memory cell array to be tested has r word lines WL and cr redundant bit lines RBL, up to r·cr defect addresses can occur in a memory test. Before it is established that the device cannot be repaired, the memory test first counts up or counts down the word lines WL before the bit line address is incremented or decremented,. It is conversely the case that, with a memory cell array with c bit lines BL and rr redundant word lines RWL and a test which firstly counts up or counts down the bit lines BL before the word line address is incremented or decremented, up to c·rr defect addresses occur before it is established that the device cannot be repaired. The buffer memory must accordingly be able to take the maximum number of W=c·rr or W=r·cr defect addresses. For exemplary numerical values r=2048, rr=24, c=512, cr=8 and an address depth of 24 bits, a size of 48 kilobytes is consequently obtained. For memory devices with an in-built self-testing unit, a solution of this type is usually too complex.

Figure 2:
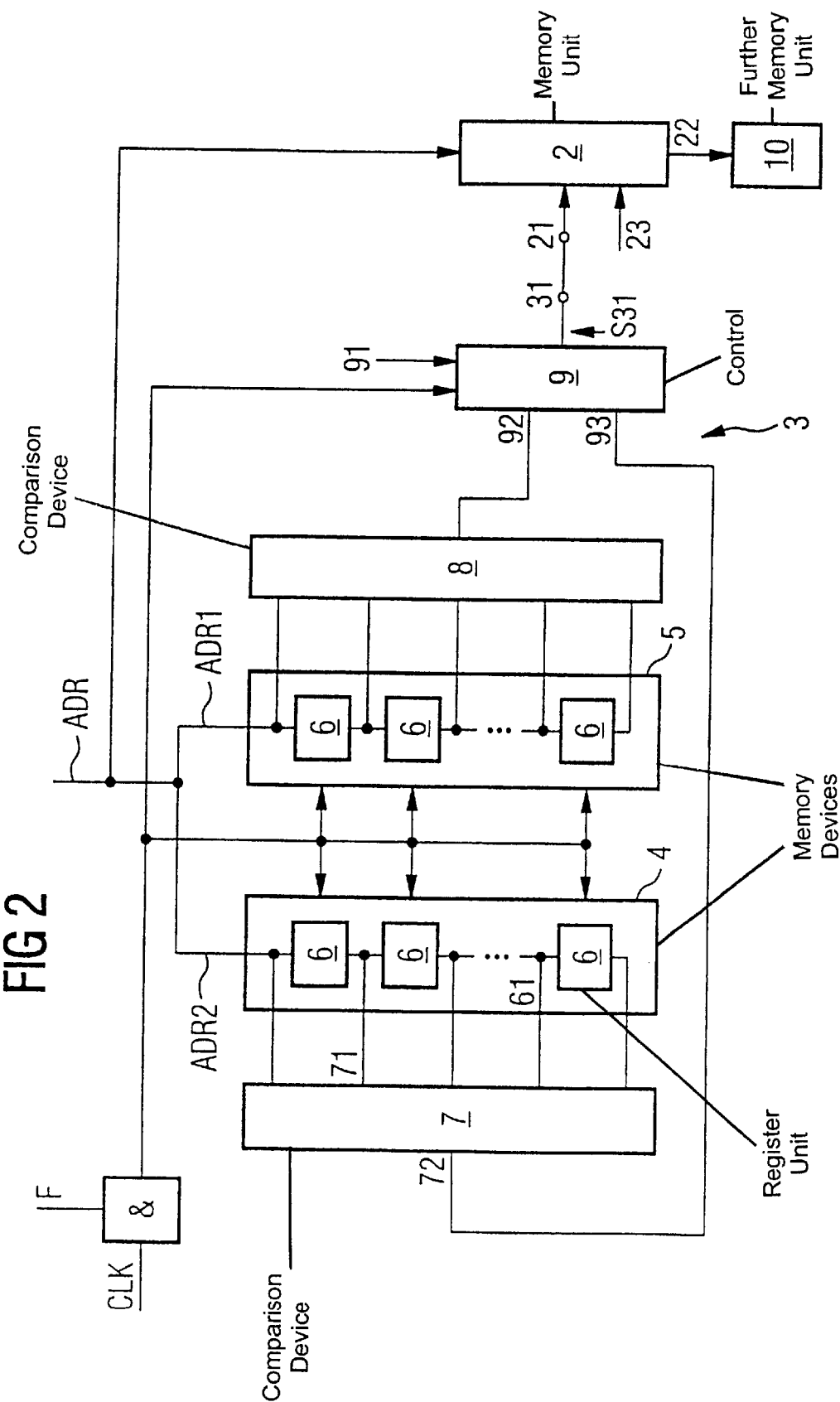
FIG. 2 shows an exemplary embodiment of a circuit configuration of a semiconductor memory.

FIG. 2 shows an embodiment of a circuit configuration according to the invention. This has a memory unit 2 for storing addresses of defective normal memory cells. The memory unit 2 has a control input 21 for controlling the storing operation of the memory unit 2 and an output 22 for outputting the memory content. The circuit configuration has, furthermore, a preprocessing device 3, which is connected via the output 31 to the control input 21 of the memory unit 2 for outputting the output signal S31. The memory unit 2 and the preprocessing device 3 are respectively fed addresses ADR of defective memory cells MC via an address bus. The addresses in this case comprise a first address part ADR1, via which the respective bit line BL is accessed, and a second address part ADR2, via which the respective word line WL is accessed.

The preprocessing device 3 has memory devices 4 and 5 for storing a fixed number of addresses of defective normal memory cells MC. Each of the memory devices 4 and 5 has register units 6 for respectively storing one of the address parts ADR 1 or ADR2. The register units 6 are connected to each other in the form of a shift register. Outputs 61 of the register units 6 are connected to inputs 71 of a comparison device 7. The output 72 of the comparison device 7 is connected to the output 31 of the preprocessing device 3 via the control 9. A comparison device 8 is connected in a way analogous to the comparison device 7 to corresponding outputs of the memory device 5 and via the control 9 to the output 31 of the preprocessing device 3. A signal 91 of the control 9 serves for switching over between the signals 92 and 93 as the input signal of the control 9. The clock signal clk and the signal F, which is generated for example by a self-testing unit, serve as control signals for controlling the storing operation of the memory devices 4 and 5 and as input signals of the control 9.

The circuit configuration has a further memory unit 10, which serves for storing addresses of defective normal memory cells MC. The further memory unit 10 is connected to the output 22 of the memory unit 2 for taking over one of the addresses stored in the memory unit 2. The further memory unit 10 serves, for example, as a defect address memory for storing defect addresses from a number of functional tests that have been carried out. The further memory unit 10 may be located inside or outside the semiconductor memory.

The sequence of a functional test of the semiconductor memory and the associated mode of operation of the circuit configuration represented in FIG. 2 is explained below in more detail.

Carried out by way of example is a functional test by which the memory cells MC along one word line WL are first tested before the next word line WL is subjected to the test. Furthermore, a complete failure of all the memory cells MC along a word line WL of the memory cell array 1 is assumed for the explanation. In response to the failure of a word line WL, with each read access to one of the memory cells MC of the word line WL to be tested, the memory test generates in quick succession a new defect address, which is initially stored in the memory unit 2 and is subsequently transferred into the defect address memory, of the further memory unit 10. As soon as more than cr defect addresses with the same word line address are in the memory unit 2, it is already established that a subsequently found defective memory cell MC can only be repaired by replacing the corresponding word line WL with a redundant word line RWL. Not enough redundant bit lines RBL are available to replace the defective memory cells MC with redundant bit lines RBL.

For the redundancy analysis which follows the memory test and in which it is established which word lines with defective memory cells are replaced by redundant word lines, it is therefore irrelevant whether cr+1 or more defect addresses with an identical word line address were taken over in the defect address memory. As soon as the memory unit 2 receives cr+1 defect addresses with an identical word line address, therefore no further defect addresses with this word line address must be accepted. Since, in the test being considered, the defect addresses with an identical word line address always occur in direct succession and not distributed over the entire test sequence, it is sufficient to test whether the last cr+1 defect addresses have the same word line address. If this is the case, no new defect address with an identical word line address must be accepted any longer in the memory unit 2. The size of the memory unit 2 is consequently restricted to the order of magnitude of cr+1 defect addresses.

In a functional test of this type, consequently a maximum of the last cr+1 defect addresses are stored in one of the memory devices 4 or 5 of the preprocessing device 3. For example, the address part ADR2 of a defect address by which the respective word line WL is accessed (word line address) is respectively stored in the register units 6 of the memory device 4. The content of the respective register units 6, i.e. the last cr word line addresses, plus the current word line address, are checked by means of the comparison device 7 to ascertain whether they coincide. If these word line addresses coincide, no new defect address with this word line address must be accepted any longer in the memory unit 2. Accordingly, the storing operation of the memory unit 2 is interrupted by the output 31.

In a functional test in which the word line address is first incremented or decremented before the bit line address is changed, analogous considerations indicate that a maximum of rr+1 defect addresses must be stored in the memory unit 2. It must consequently be tested in the preprocessing device 3 whether the last rr+1 defect addresses have the same bit line address. This takes place with the memory device 5 in connection with the comparison device 8 with respect to the address part ADR1 (bit line address). A parallel comparison of the current bit line address ADR1 with the last rr addresses stored in the memory device 5 takes place.

The size of the memory unit 2 is restricted for both types of functional tests to the order of magnitude of the maximum value from W=rr+1 or W=cr+1. To be able to ensure operability in a so-called worst-case scenario, the memory unit 2 is expediently to be made twice the maximum value W. Such a worst case occurs, for example, if the last-tested memory cells MC along a word line WL are defective and, after the word line address has been incremented or decremented, the first-tested memory cells MC of the next word line are defective. For the above numerical example, the memory space requirement of the memory unit 2 is consequently reduced to the order of magnitude of 150 bytes.

With the control signal 91 it is selected whether the word line addresses ADR2, bit line addresses ADR1 or both parts of the defect addresses are tested to ascertain whether they coincide, for example because of a changed redundancy analysis. The signals F and clk are used for example for controlling the point in time of the storing operation or the relevant clock rate. The control input 23 of the memory unit 2 is used for controlling the taking over of an address stored in the memory unit 2 into the further memory unit 10.

I claim:

1. An integrated semiconductor memory which can be subjected to a memory cell test for determining operative and defective memory cells, the integrated semiconductor memory comprising:

addressable normal memory cells;

addressable redundant memory cells for replacing one of said normal memory cells; and a test circuit including:

a device for determining addresses of defective ones of said normal memory cells, a memory unit for storing addresses of the defective ones of said normal memory cells, said memory unit having a control input for controlling a storing operation of said memory unit and an output for outputting a content of said memory unit, and a preprocessing device including at least one memory device for storing a fixed number of addresses of defective ones of said normal memory cells, said preprocessing device having a comparison device for a comparison between the addresses stored in said memory device, said preprocessing device having an output for outputting an output signal in accordance with a result of the comparison, said output of said preprocessing device connected to said control input of said memory unit.

2. The integrated semiconductor memory according to claim 1, wherein:

said normal memory cells are configured in a memory cell array in matrix form;

said memory cells are combined into addressable units of column lines and row lines; and addresses of said normal memory cells include a first address part, via which a respective column line is accessed, and a second address part, via which a respective row line is accessed.

3. The integrated semiconductor memory according to claim 2, wherein said memory device has register units that are connected to each other forming a shift register, said register units for storing address portions of the addresses of defective ones of said normal memory cells, each of the address portions selected from the group consisting of the first address part and the second address part.

4. The integrated semiconductor memory according to claim 3, comprising:

a comparison device for performing a comparison between a content of said register units, said comparison device having an output connected to said output of said preprocessing device for outputting a result of the comparison, said comparison device having inputs;

said register units having outputs connected to said inputs of said comparison device.

5. The integrated semiconductor memory according to claim 4, wherein mutually corresponding address parts (ADR2) are respectively stored in said register units, a comparison of a content of said register units to ascertain whether the corresponding address parts coincide is performed, and if they coincide, the storing operation of said memory unit is interrupted.

6. The integrated semiconductor memory according to claim 1, comprising a further memory unit for storing addresses of defective ones of said normal memory cells, said further memory unit connected to said output of said memory unit for taking over an address stored in said memory unit.

* * * * *

UNITED STATES PATENT AND TRADEMARK OFFICE
CERTIFICATE OF CORRECTION

PATENT NO. : 6,320,804 B1
DATED : November 20, 2001
INVENTOR(S) : Wilfried Daehn It is certified that error appears in the above-identified patent and that said Letters Patent is hereby corrected as shown below:

<u>Title page,</u>
Item [54] should read as follows:

-- INTEGRATED SEMICONDUCTOR MEMORY WITH A MEMORY UNIT FOR STORING ADDRESSES OF DEFECTIVE MEMORY CELLS --

Signed and Sealed this

Twenty-sixth Day of March, 2002

*Attest:*

JAMES E. ROGAN
*Attesting Officer*   *Director of the United States Patent and Trademark Office*